(12) United States Patent
Liu

(10) Patent No.: US 7,635,858 B2
(45) Date of Patent: Dec. 22, 2009

(54) ORGANIC LIGHT-EMITTING DEVICE WITH IMPROVED LAYER CONDUCTIVITY DISTRIBUTION

(75) Inventor: Tswen-Hsin Liu, Jhudong Township, Hsinchu County (TW)

(73) Assignee: AU Optronics Corporation, Hsinchu (TW)

( * ) Notice: Subject to any disclaimer, the term of this patent is extended or adjusted under 35 U.S.C. 154(b) by 205 days.

(21) Appl. No.: 11/200,956

(22) Filed: Aug. 10, 2005

(65) Prior Publication Data

US 2007/0034864 A1  Feb. 15, 2007

(51) Int. Cl.
*H01L 51/54* (2006.01)
*C09K 11/06* (2006.01)

(52) U.S. Cl. .......... 257/40; 257/E51.018; 257/E51.026; 428/690; 252/301.33; 313/504

(58) Field of Classification Search .................. 257/40, 257/E51.001, E51.018–E51.019, E51.026; 438/99; 428/690, 917; 252/301.33; 313/503–504
See application file for complete search history.

(56) References Cited

U.S. PATENT DOCUMENTS

| | | | | |
|---|---|---|---|---|
| 5,739,635 | A * | 4/1998 | Wakimoto .................. | 313/504 |
| 6,069,442 | A | 5/2000 | Hung et al. ................. | 313/504 |
| 6,172,459 | B1 | 1/2001 | Hung et al. ................. | 313/506 |
| 6,281,627 | B1 | 8/2001 | Arai et al. .................. | 313/506 |
| 6,303,238 | B1 * | 10/2001 | Thompson et al. .......... | 428/690 |
| 6,579,629 | B1 | 6/2003 | Raychaudhuri et al. ..... | 428/690 |
| 6,627,333 | B2 | 9/2003 | Hatwar ....................... | 428/690 |
| 6,765,349 | B2 | 7/2004 | Liao et al. ................... | 313/504 |
| 6,885,025 | B2 * | 4/2005 | Tung et al. .................. | 257/40 |
| 7,138,763 | B2 * | 11/2006 | Liao et al. ................... | 313/504 |
| 2002/0011783 | A1 * | 1/2002 | Hosokawa ................... | 313/504 |

(Continued)

FOREIGN PATENT DOCUMENTS

CN  1617355  5/2005

(Continued)

OTHER PUBLICATIONS

Huang, J., et al. "Low-Voltage Organic Electroluminescent Devices Using pin Structures." Appl. Phys. Lett. vol. 80 (2002): pp. 139-141.*

(Continued)

*Primary Examiner*—Douglas M Menz
*Assistant Examiner*—Matthew W Such
(74) *Attorney, Agent, or Firm*—Ware, Fressola, Van Der Sluys & Adolphson, LLP

(57) ABSTRACT

An OLED comprises an anode, a hole source, an emissive region, an electron source and a cathode, wherein the materials for the electron source and the hole source are chosen such that the electrical conductivity of these charge carrier sources is greater than the electrical conductivity of the emissive region. In particular, the electrical conductivity of the source layers is between $10^{-8}$ to $10^2$ S/cm. Furthermore, one or both of the hole source and the electron source are made substantially of one or more inorganic materials. The emissive region can have one or more layers of organic material. The materials for the emissive region are insulators. The cathode can be made of a metal such as Mg:Ag and Al, and the anode is made of ITO or the like. The electrical conductivity of the cathode and the anode is significantly higher than $10^2$ S/cm.

13 Claims, 11 Drawing Sheets

U.S. PATENT DOCUMENTS

| | | | | |
|---|---|---|---|---|
| 2003/0127967 | A1 | 7/2003 | Tsutsui et al. | 313/498 |
| 2003/0230980 | A1* | 12/2003 | Forrest et al. | 313/600 |
| 2005/0074629 | A1* | 4/2005 | Forrest et al. | 428/690 |
| 2005/0104511 | A1 | 5/2005 | Liao et al. | 313/503 |
| 2005/0106419 | A1* | 5/2005 | Endoh et al. | 428/690 |
| 2007/0051945 | A1* | 3/2007 | Nakayama et al. | 257/40 |

FOREIGN PATENT DOCUMENTS

| | | |
|---|---|---|
| JP | 02-139892 | 5/1990 |
| JP | 11-149985 | 6/1999 |
| JP | 2000-150166 | 5/2000 |
| JP | 2000-215983 | 8/2000 |
| JP | 2000-223272 | 8/2000 |
| JP | 200315581 | 11/2000 |
| JP | 2000-340364 | 12/2000 |
| JP | 2000-348866 | 12/2000 |
| JP | 2002-161135 | 6/2002 |
| JP | 2002175879 | 6/2002 |
| JP | 2002-353165 | 12/2002 |
| JP | 2003-297575 | 10/2003 |
| WO | WO 03/107452 A1 * | 12/2003 |
| WO | WO 2005060012 A1 * | 6/2005 |

OTHER PUBLICATIONS

Baldo, M.A., "Exciton Singlet-Triplet Ratio in a Semiconductor Organic Thin Film." Phys. Rev. B. vol. 60 (1999): pp. 14422-14428.*

D'Andrade, B.W. and Forrest, S.R. "Effects of Exciton and Charge Confinement on the Performance of White Organic p-i-n Electrophosphorescent Emissive Excimer Devices." J. Appl. Phys., vol. 94, No. 5 (Sep. 1, 2003): pp. 3101-3108.*

Huang, J., et al. "Low-Voltage Organic Electroluminescent Devices Using pin Structures." Appl. Phys. Lett., vol. 80, No. 1 (Jan. 7, 2002): pp. 139-141.*

Blochwitz, J. "Organic Light-Emitting Diodes with Doped Charge Transport Layers." Doctoral Dissertation. Technical University of Dresden. (Jul. 12, 2001).*

He, G., et al. "Very High-Efficiency and Low Voltage Phosphorescent Organic Light-Emitting Diodes Based on a p-i-n Junction." J. Appl. Phys., vol. 95, No. 10 (May 15, 2004): pp. 5773-5777.*

Huang, J., et al. "Influence of the Thickness and Doping of the Emission Layer on the Performance of Organic Light-Emitting Diodes with PiN Structure." J. Appl. Phys., vol. 93, No. 2 (Jan. 15, 2003): pp. 838-844.*

Pfeiffer, M., et al. "Electrophosphorescent p-i-n Organic Light-Emitting Devices for Very-High-Efficiency Flat-Panel Displays." Adv. Mater., vol. 14, No. 22 (Nov. 18, 2002): pp. 1633-1636.*

Pfeiffer, M., et al. "A Low Drive Voltage, Transparent, Metal-Free n-i-p Electrophosphorescent Light Emitting Diode." Org. Elect., vol. 4 (2003): pp. 21-26.*

Pfeiffer, M., et al. "Doped Organic Semiconductors: Physics and Application In Light Emitting Diodes." Org. Elect., vol. 4 (2003): pp. 89-103.*

Gebeyehu, D., et al. "highly Efficient Deep-Blue Organic Light-Emitting Diodes With Doped Transport Layers." Synth. Met., vol. 148 (2005): pp. 205-211.*

Zhou, X., et al. "Inverted Transparent Multi-Layered Vacuum Deposited Organic Light-Emitting Diodes With Electrically Doped Carrier Transport Layers and Coumarin Doped Emissive Layer." Synth. Met., vol. 138 (2003): pp. 193-196.*

* cited by examiner

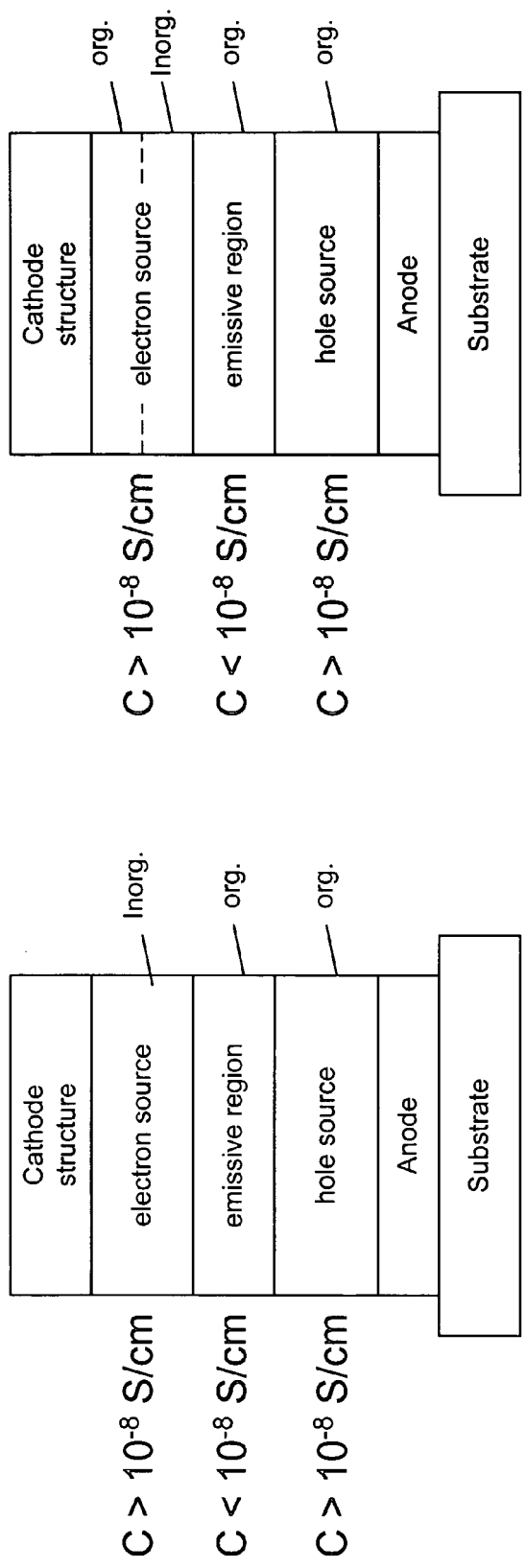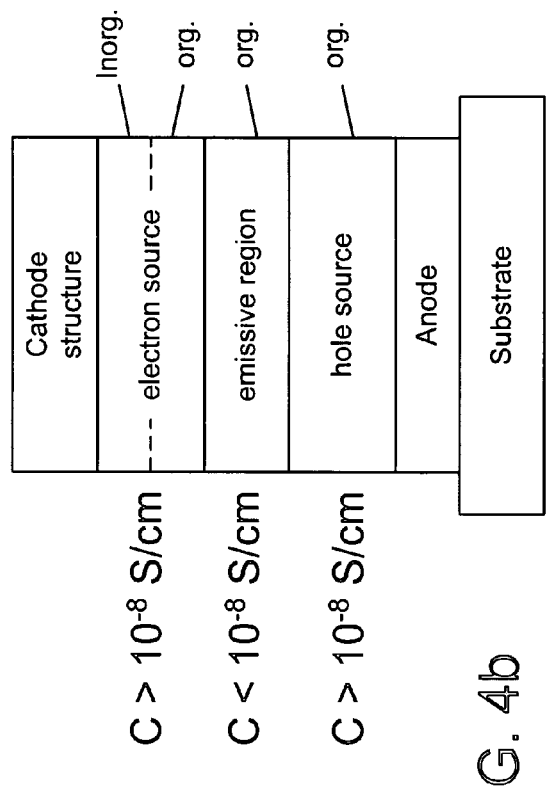
FIG. 4a
FIG. 4b
FIG. 4c

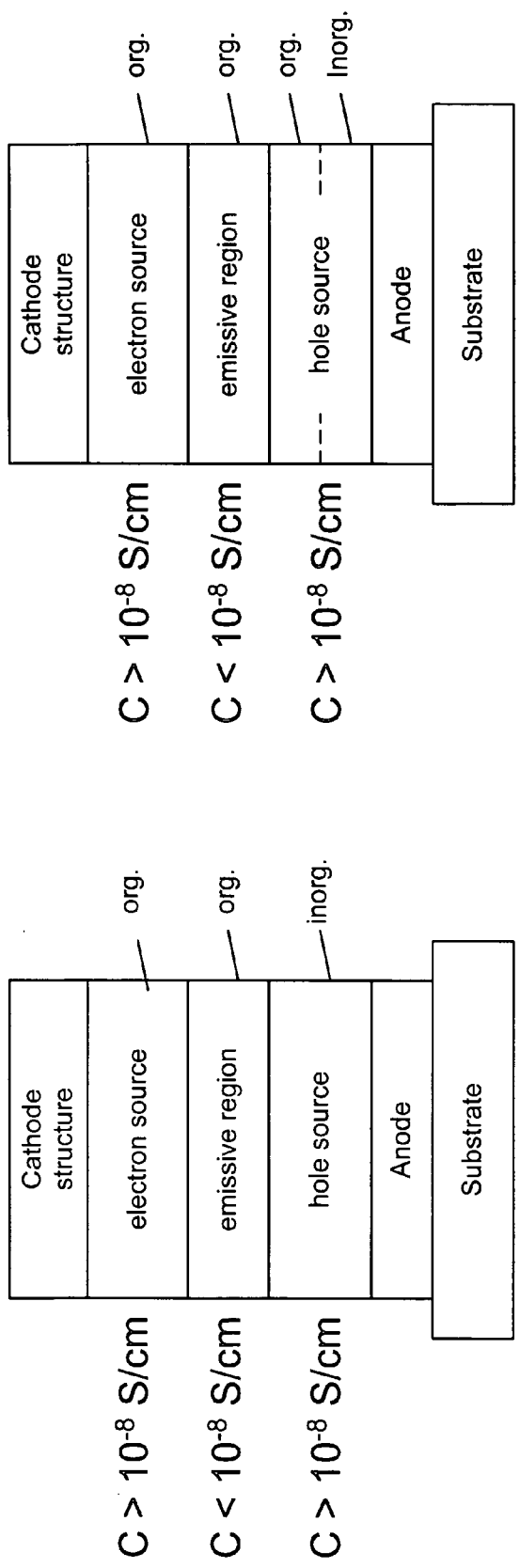
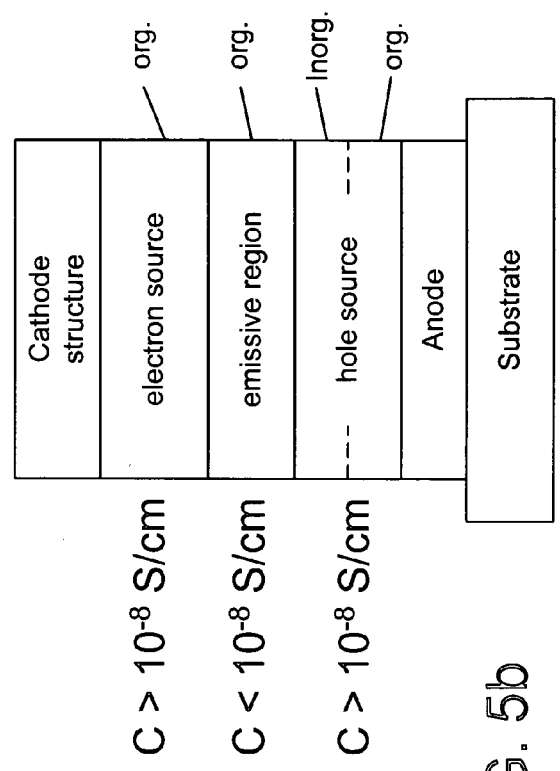
FIG. 5a
FIG. 5b
FIG. 5c

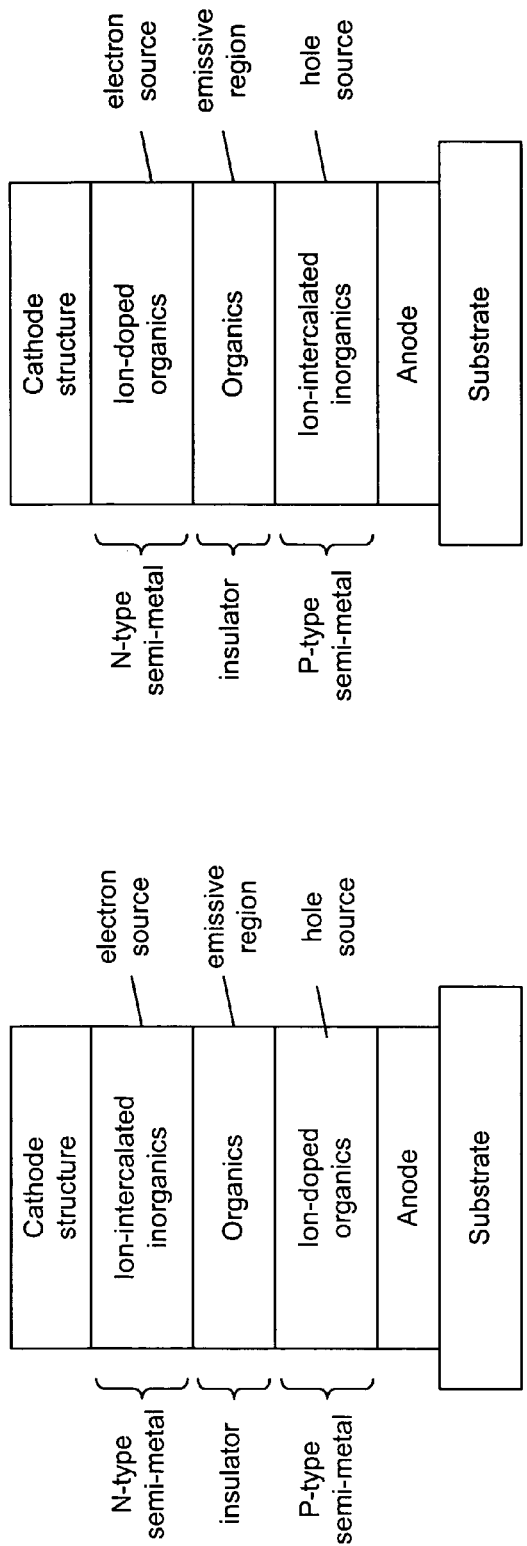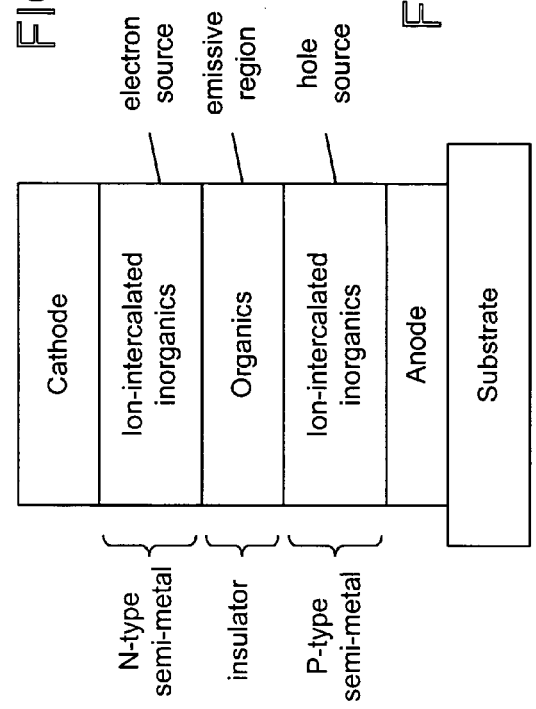
FIG. 8a
FIG. 8b
FIG. 8c

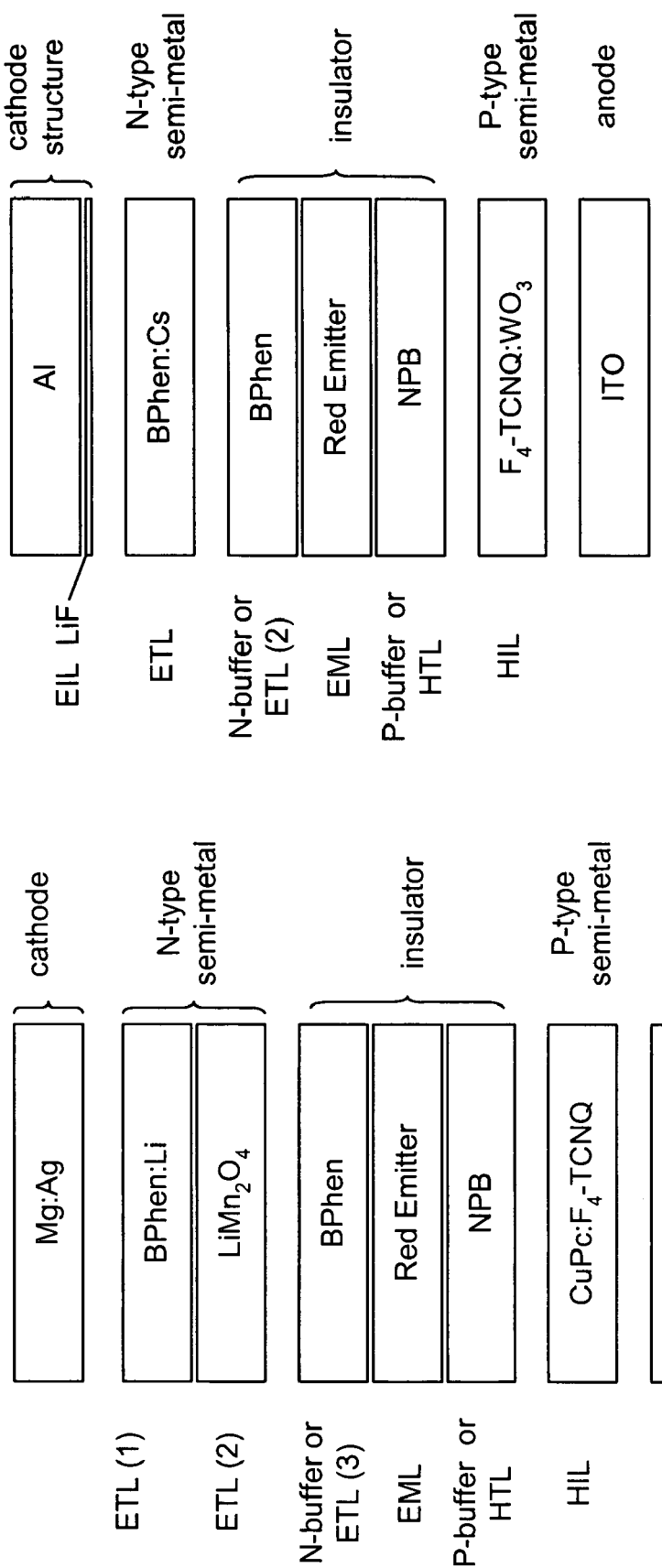

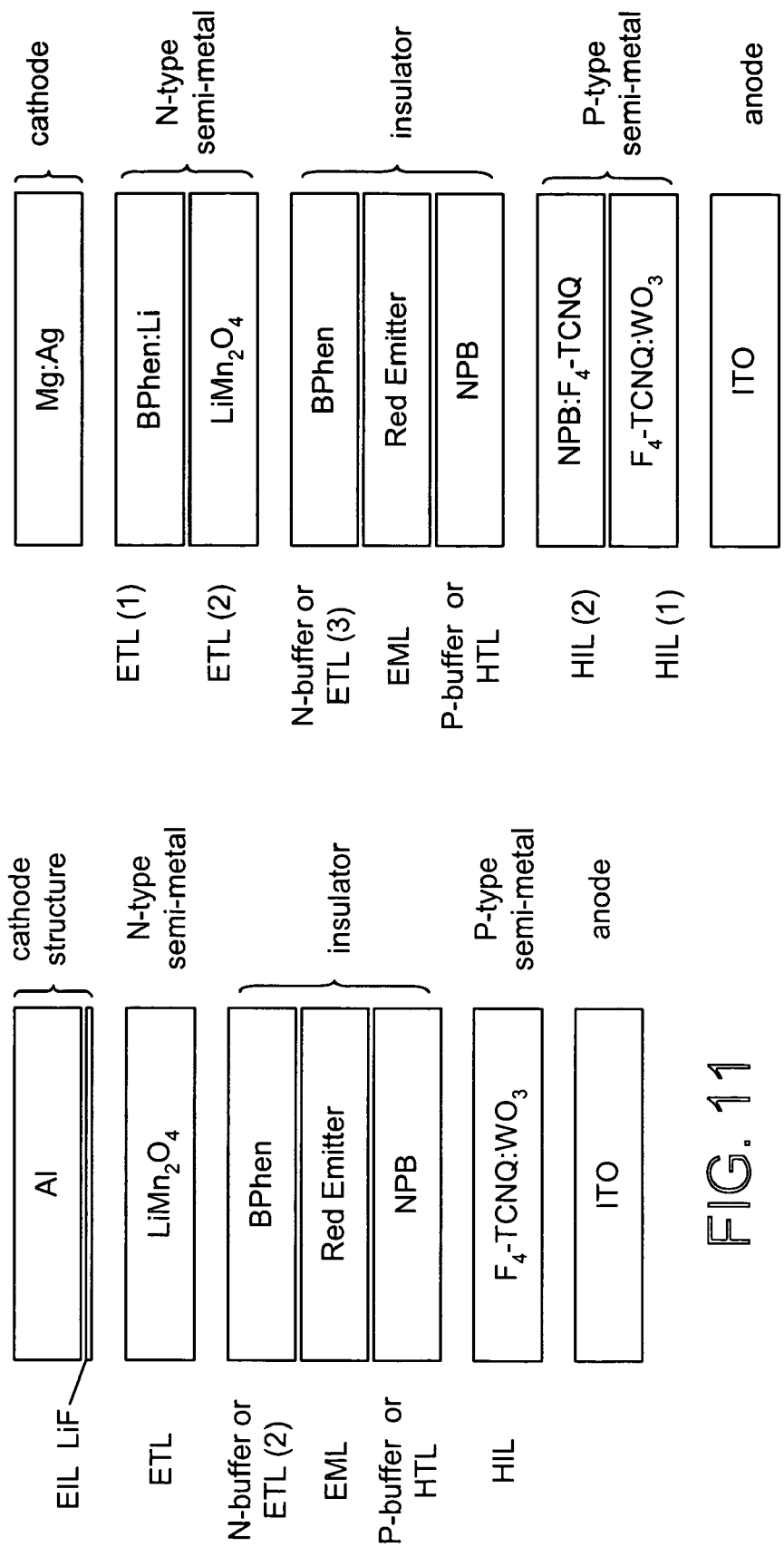

ORGANIC LIGHT-EMITTING DEVICE WITH IMPROVED LAYER CONDUCTIVITY DISTRIBUTION

CROSS REFERENCES TO RELATED APPLICATIONS

The present invention is related to a co-pending application Ser. No. 10/995,878, filed Nov. 23, 2004, assigned to the assignee of the present invention.

FIELD OF THE INVENTION

The present invention relates generally to photoelectric devices and, more specifically, to organic light-emitting diodes.

BACKGROUND OF THE INVENTION

Organic light-emitting diodes (OLEDs) are known in the art. For example, Hung et al. (U.S. Pat. No. 5,776,623) also discloses an electroluminescent device wherein a 15 nm-thick CuPc layer is used as a hole injection layer (HIL), a 60 nm-thick NPB layer is used as a hole transport layer (HTL), a 75 nm-thick Alq$_3$ layer is used as an electron transport layer (ETL). A 0.5 nm-thick lithium fluoride layer is also deposited on the Alq$_3$ layer. The lithium fluoride layer can be replaced by a magnesium fluoride, a calcium fluoride, a lithium oxide or a magnesium oxide layer.

Kido et al. (U.S. Pat. No. 6,013,384) discloses, as shown in FIG. 1a, an organic electroluminescent device 10 wherein the optoelectronic sub-structure consists of a hole transport layer (HTL) 13, a luminescent layer 14 and a metal-doped organic compound layer 15 disposed between an anode layer 12 and a cathode layer 16. The device is fabricated on a substrate 11.

Weaver et al. (U.S. Publication No. 2004/0032206 A1) discloses another OLED including an alkali metal compound layer. As shown in FIG. 1b, the OLED 20 is fabricated on a plastic substrate 21 pre-coated with an ITO anode 22. The cathode consists of two layers: a metal oxide layer 28 deposited over a layer 27 of Mg or Mg alloy, such as an alloy of Mg and Ag. The alkali metal compound layer 26 can be made of alkali halides or alkali oxides such as LiF and Li$_2$O. The organic layers include an HTL layer 23, an emissive layer (EML) 24 and an electron transport layer (ETL) 25.

Raychaudhuri et al. (U.S. Pat. No. 6,551,725 B2) discloses an OLED 30 wherein a buffer structure is disposed between the organic layer and the cathode. As shown in FIG. 1c, the buffer structure consists of two layers, a first layer 37 containing an alkali halide is provided over the electron transport layer (ETL) 36, and a second buffer layer 38 containing a metal or metal alloy having a work function between 2.0 and 4.0 eV is provided over the first buffer layer 37. In addition, a hole injection layer (HIL) 33 is provided between the anode 32 and the organic layers. The hole injection layer can be made of a porphorinic or phthalocyanine compound. The hole injection layer can also be made of a fluorinated polymer CF$_x$, where x is 1 or 2. The hole transport layer (HTL) 34 can be made of various classes of aromatic amines. The emissive layer (EML) 35 provides the function of light emission produced as a result of recombination of holes and electrons in the layer. The cathode layer 39 is made by sputter deposition to provide increased conductivity and reflectivity of the electron injection layer of the device.

A generalized OLED structure is shown in FIG. 2. The hole injection and transport layers together can be treated as a hole source. The electron injection and transport layers together can be treated as an electronic source. One or both the electron source and the hole source can be made of organic or inorganic materials. The emissive layer is made of an organic host material doped with a fluorescent or phosphorescent dopant. In general, the electrical conductivity of prior art interlayers is lower than $10^{-8}$ S/cm (S=$\Omega^{-1}$), limiting the light-emitting efficiency of the device.

It is known that a PIN diode is a photoelectric device with a large, neutrally doped intrinsic region sandwiched between p-doped and n-doped semiconducting regions. The doping in the p-doped and n-doped regions significantly increases the electrical conductivity of the semiconductor material and the efficiency of the device.

It would be desirable and advantageous to improve the device efficiency of an OLED by changing the electrical conductivity distribution in various layers in the OLED.

SUMMARY OF THE INVENTION

It is an object of the present invention to improve the device efficiency of an organic light-emitting device (OLED). This object can be achieved by choosing the materials for the electron source and the hole source such that the electrical conductivity of these source layers is greater than the electrical conductivity of the emissive region. In particular, the electrical conductivity of the source layers is between $10^{-8}$ to $10^2$ S/cm. Furthermore, one or both of the hole source and the electron source are made substantially of one or more inorganic materials. The emissive region can have one or more layers of organic material. The materials for the emissive region are insulators.

In the OLED of the present invention, the cathode can be made of a metal such as Mg:Ag and Al, and the anode is made of ITO or the like. Thus, the electrical conductivity of the cathode and the anode is significantly higher than $10^2$ S/cm. A thin layer of LiF can be disposed between the cathode and the electron source to serve as an electron injection layer.

Furthermore, one or more of the hole and electron source layers are made of an inorganic material. One of the hole and electron source layers can be made of an ion-doped organic material.

The present invention will become apparent upon reading the description taken in conjunction with FIGS. 3 to 12.

BRIEF DESCRIPTION OF THE DRAWINGS

FIG. 4a is a schematic representation showing the electrical conductivity distribution in an exemplary OLED, according to the present invention, wherein the hole source is made of an organic material and the electron source is made of an inorganic material.

FIG. 4b is a schematic representation showing the electrical conductivity distribution in an exemplary OLED, according to the present invention, wherein the hole source is made of an organic material and the electron source comprises an inorganic and an organic layer.

FIG. 4c is a schematic representation showing the electrical conductivity distribution in another exemplary OLED, according to the present invention, wherein the hole source is made of an organic material and the electron source also comprises an inorganic layer and an organic layer.

FIG. 5a is a schematic representation showing the electrical conductivity distribution in an exemplary OLED, according to the present invention, wherein the electron source is made of an organic material and the hole source is made of an inorganic material.

FIG. 5b is a schematic representation showing the electrical conductivity distribution in an exemplary OLED, according to the present invention, wherein the electron source is made of an organic material and the hole source comprises an inorganic layer and an organic layer.

FIG. 5c is a schematic representation showing the electrical conductivity distribution in another exemplary OLED, according to the present invention, wherein the electron source is made of an organic material and the hole source also comprises an inorganic layer and an organic layer.

FIG. 8a is a schematic representation showing the materials in an exemplary OLED, according to the present invention.

FIG. 8b is a schematic representation showing the materials in another exemplary OLED, according to the present invention.

FIG. 8c is a schematic representation showing the materials in yet another exemplary OLED, according to the present invention.

FIG. 9c is a schematic representation showing an OLED, according to yet another embodiment of the present invention, wherein the hole source is made of an organic material.

FIG. 10a is a schematic representation showing an OLED, according to an embodiment of the present invention, wherein the electron source is made of an organic material.

FIG. 11 is a schematic representation showing an OLED, according to an embodiment of the present invention, wherein both the electron and hole sources are made of inorganic materials.

FIG. 12 is a schematic representation showing an OLED, according to an embodiment of the present invention, wherein each of the electron and hole sources comprises an inorganic material and an organic material.

DETAILED DESCRIPTION OF THE INVENTION

Figure 1B:
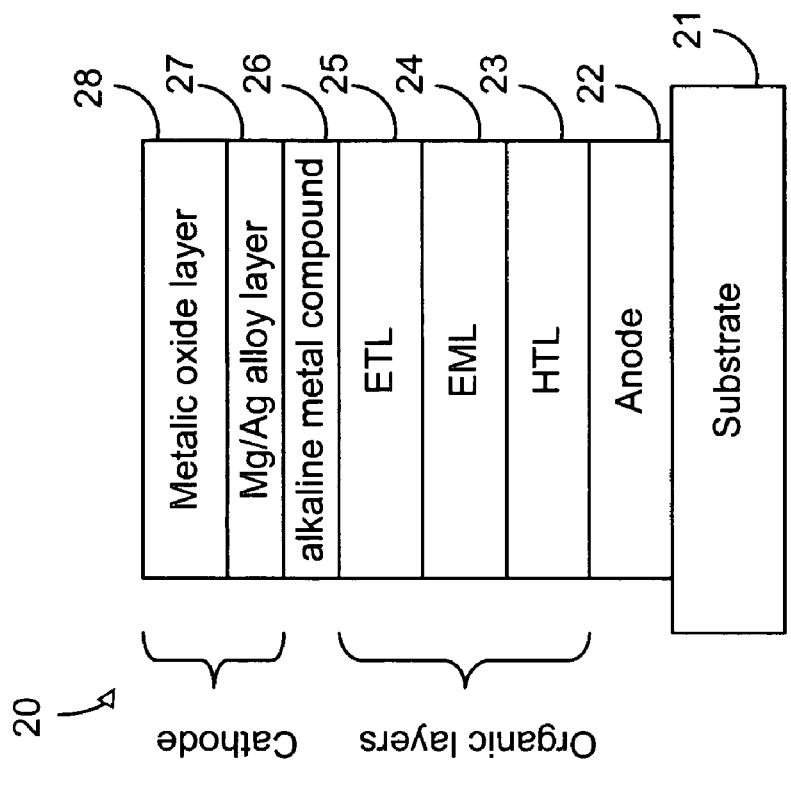
FIG. 1b is a schematic representation showing another prior art organic light-emitting diode.
Figure 1A:
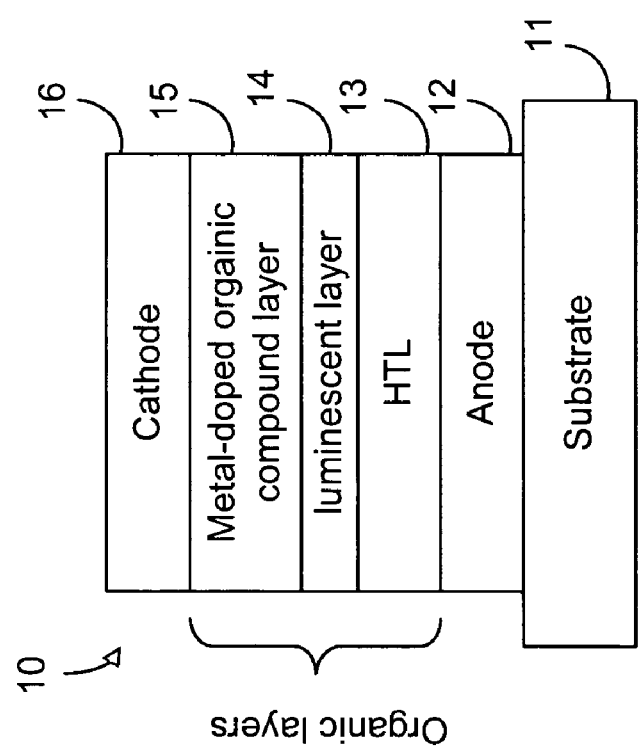
FIG. 1a is a schematic representation showing a prior art organic light-emitting diode.
Figure 2:
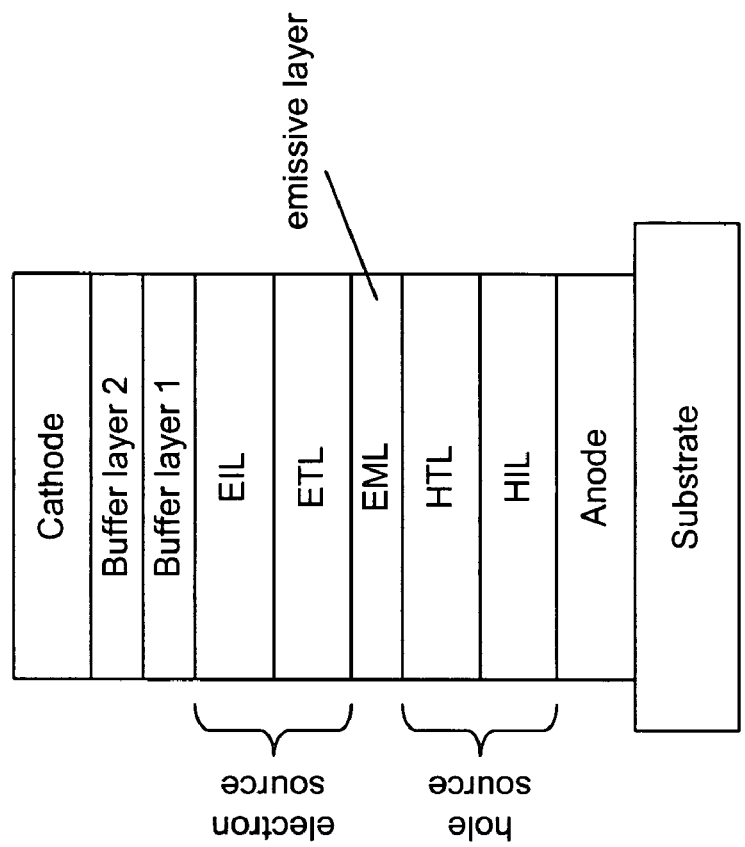
FIG. 2 is a schematic representation showing a generalized OLED.
Figure 1C:
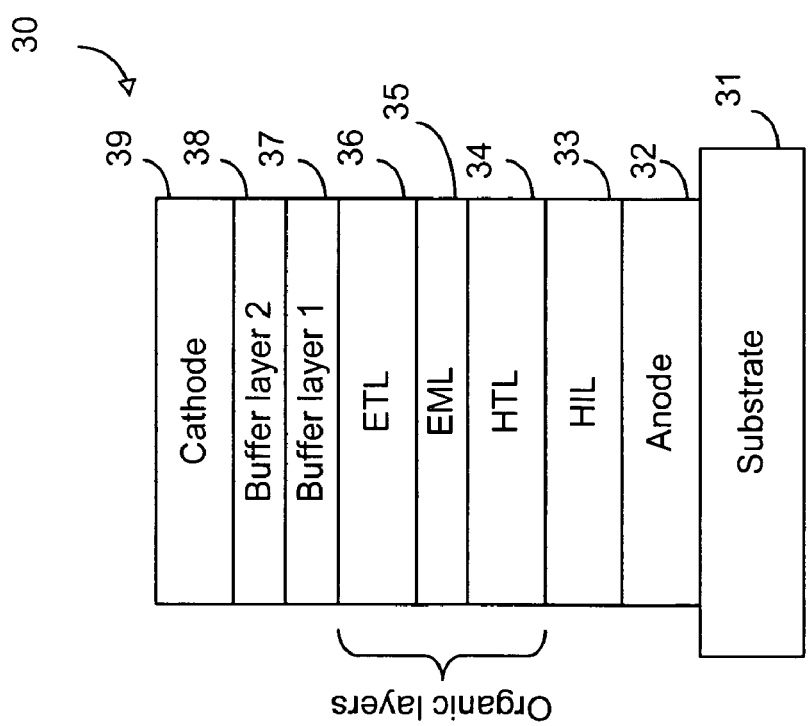
FIG. 1c is a schematic representation showing yet another prior art organic light-emitting diode.
Figure 3:
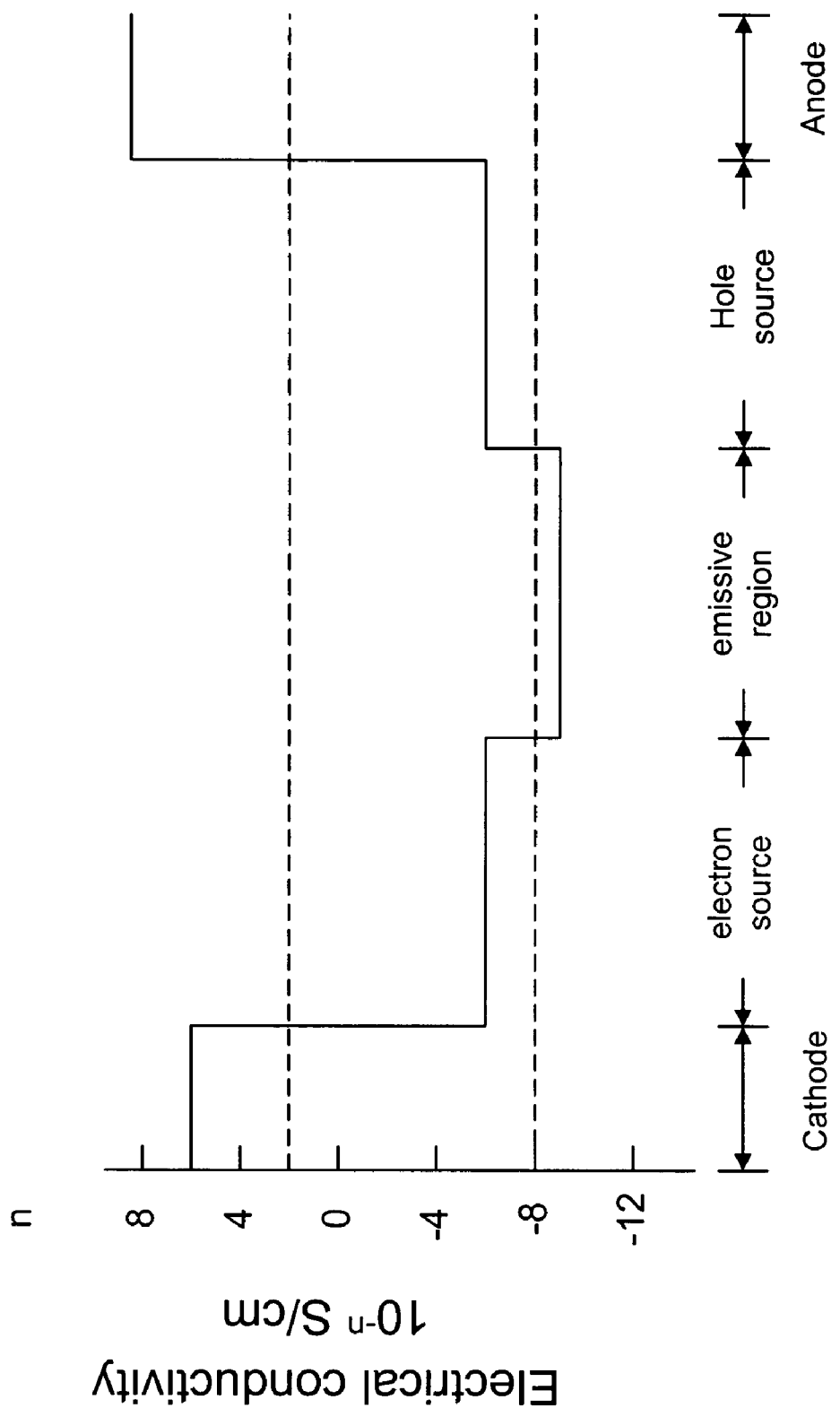
FIG. 3 is a schematic representation showing the electrical conductivity distribution among various regions of the OLED, according to the present invention.

The organic light-emitting device (OLED), according to the present invention, comprises a cathode, an electron source, an emissive layer, a hole source and an anode. The materials for use in the electron source and the hole source are chosen such that the electrical conductivity of the electron source and the hole source is higher than that of the emissive layer, but significantly lower than that of the cathode and the anode. In particular, the electrical conductivity of the emissive layer is lower than $10^{-8}$ S/cm, and the electrical conductivity of the source layers is between $10^{-8}$ to $10^2$ S/cm, as illustrated in FIG. 3. If the cathode is made of a metal such as Ag and Al, then its electrical conductivity is higher than $10^6$ S/cm. If the anode is made of ITO, then its electrical conductivity is between $10^3$ to $5 \times 10^3$ S/cm.

One or both of the electron source and the hole source in the OLED, according to present invention, are made of an inorganic material having an electrical conductivity greater than $10^{-8}$ S/cm. FIGS. 4a-4c are schematic representations showing the electrical conductivity distribution in an exemplary OLED, according to the present invention, wherein the hole source is made of an organic material. The OLED has a cathode structure, which can be a single electrode or a combination of an electrode and a thin layer of electron injection material. The electron source can be entirely made of an inorganic material. The electron source can be one layer of the same material or a plurality of layers of different materials. The electron source can be made of an inorganic material, as shown in FIG. 4a. However, the electron source can have an inorganic layer and an organic layer. The inorganic layer can be located adjacent to the cathode structure, as shown in FIG. 4b, or the inorganic layer can be located adjacent to the emissive region, as shown in FIG. 4c.

FIGS. 5a-5c are schematic representations showing the electrical conductivity distribution in an exemplary OLED, according to the present invention, wherein the electron source is made of an organic material. The hole source can be made of an inorganic material, as shown in FIG. 5a. However, the hole source can have an inorganic layer and an organic layer. The organic layer can be located adjacent to the anode, as shown in FIG. 5b, or the organic layer can be located adjacent to the emissive region, as shown in FIG. 5c.

Figure 6:
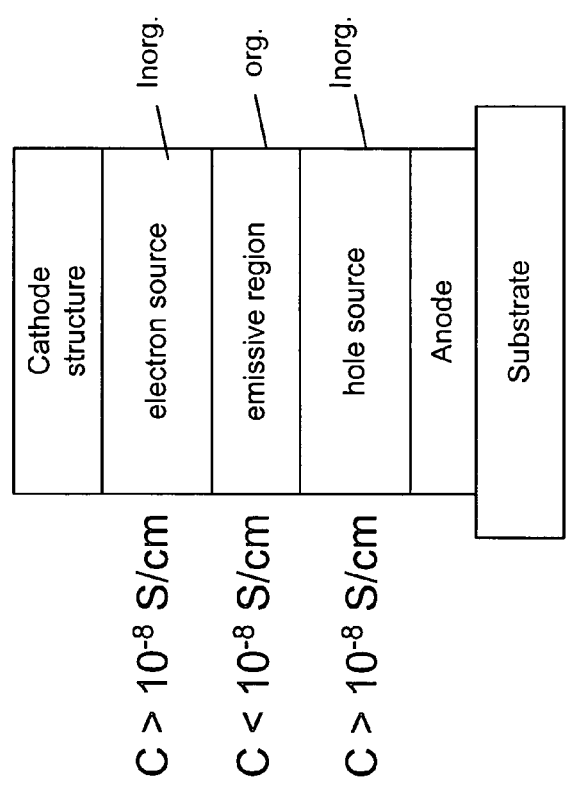
FIG. 6 is a schematic representation showing the electrical conductivity distribution in an exemplary OLED, according to the present invention, wherein both the electron source and the hole source are made of inorganic materials.

FIG. 6 is a schematic representation showing the electrical conductivity distribution in an exemplary OLED, according to the present invention, wherein both the electron source and the hole source are made of inorganic materials.

Figure 7:
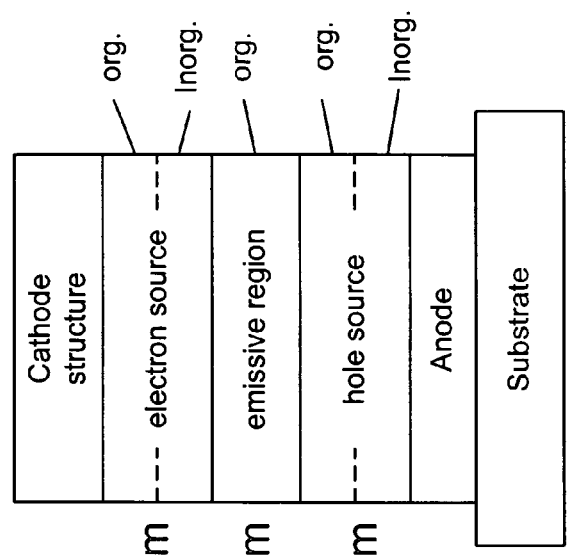
FIG. 7 is a schematic representation showing the electrical conductivity distribution in an exemplary OLED, according to the present invention, wherein each of the electron and hole sources comprises an inorganic layer and an organic layer.

FIG. 7 is a schematic representation showing the electrical conductivity distribution in an exemplary OLED, according to the present invention, wherein each of the electron and hole sources comprises an inorganic layer and an organic layer.

In order to increase the electrical conductivity of the hole source and the electron source, it is desirable to use a semi-metal for these sources. A semi-metal has an electrical conductivity between $10^{-8}$ to $10^2$ S/cm. For example, ion-intercalated inorganic compound and ion-doped organic material can be used to achieve the electrical conductivity of $10^{-6}$ S/cm and higher. Further exemplary embodiments of the OLED, according to the present invention, are shown in FIGS. 8a to 8c.

FIGS. 8a-8c is are schematic representations showing the materials in the OLED, according to the present invention. As shown in FIG. 8a, the electron source contains an ion-intercalated inorganic material which is an N-type semi-metal, and the hole source contains an ion-doped organic material which is a P-type semi-metal. The emission region contains one or more organic materials. As shown in FIG. 8b, the hole source contains an ion-intercalated inorganic material which is a P-type semi-metal, and the electron source contains an ion-doped organic material which is an N-type semi-metal. The emission region contains one or more organic materials. As shown in FIG. 8c, the electron source contains an ion-intercalated inorganic material which is an N-type semi-metal, and the hole source contains an ion-intercalated inorganic material which is a P-type semi-metal. The emission region contains one or more organic materials.

The ion-intercalated inorganic compound for use in the electron source can be an oxide-based alkali or alkaline-earth metal compound, for example. The oxide-based inorganic compound can be selected from a group of metal-oxides characterized by the chemical formula of $A_x(M_yO_z)$, where
  x, y, z are positive integers greater than zero;
  A is selected from the group consisting of alkali and alkaline-earth elements;
  M is selected from the group consisting of metals, transitional metals and alloys; and
  O is an oxygen atom.

Some of the ion-intercalated inorganic compounds are $LiMn_2O_4$, $LiCoO_2$, $LiNbO_3$, $Li_2WO_4$, $Cs_2WO_4$, $CsMnO_4$, $CsVO_4$, $CsTi_6O_{13}$, $MgTiO_3$, $MgWO_4$, $MgZrO_3$, $Li(Ni_{0.8}Co_{0.2})O_2$. In the above compounds:
  Li=Lithium
  Mn=Manganese
  O=Oxygen
  Co=Cobalt
  Nb=Niobium
  W=Tungsten
  Cs=Cesium
  V=Valadium
  Ti=Titanium
  Mg=Magnesium
  Zr=Zirconium
  Ni=Nickel The ion-intercalated inorganic compound for use in the hole source can be an inorganic compound selected from a group of oxides characterized by having the chemical formula of $P_x(M_yO_z)$, where
  x, y, z are positive integers greater than zero;
  P is a p-dopant, such as tetrafluoro-tetracyano-quinodimethane ($F_4$-TCNQ);
  M is selected from the group consisting of metals, transitional metals and alloys; and
  O is an oxygen atom.

An example of the ion-doped organic material is p-dope amine, which has an electrical conductivity in the range of $4\times10^{-7}$ to $6\times10^{-6}$ S/cm. Organic material not doped with ions usually has an electrical conductivity lower than $10^{-9}$ S/cm and can be considered as an electrical insulator. Another example of the ion-doped organic material is Li-doped organic material which has an electrical conductivity in the range of $2\times10^{-5}$ to $5\times10^{-5}$ S/cm.

Exemplary Embodiments

Figures 9A, 9B:
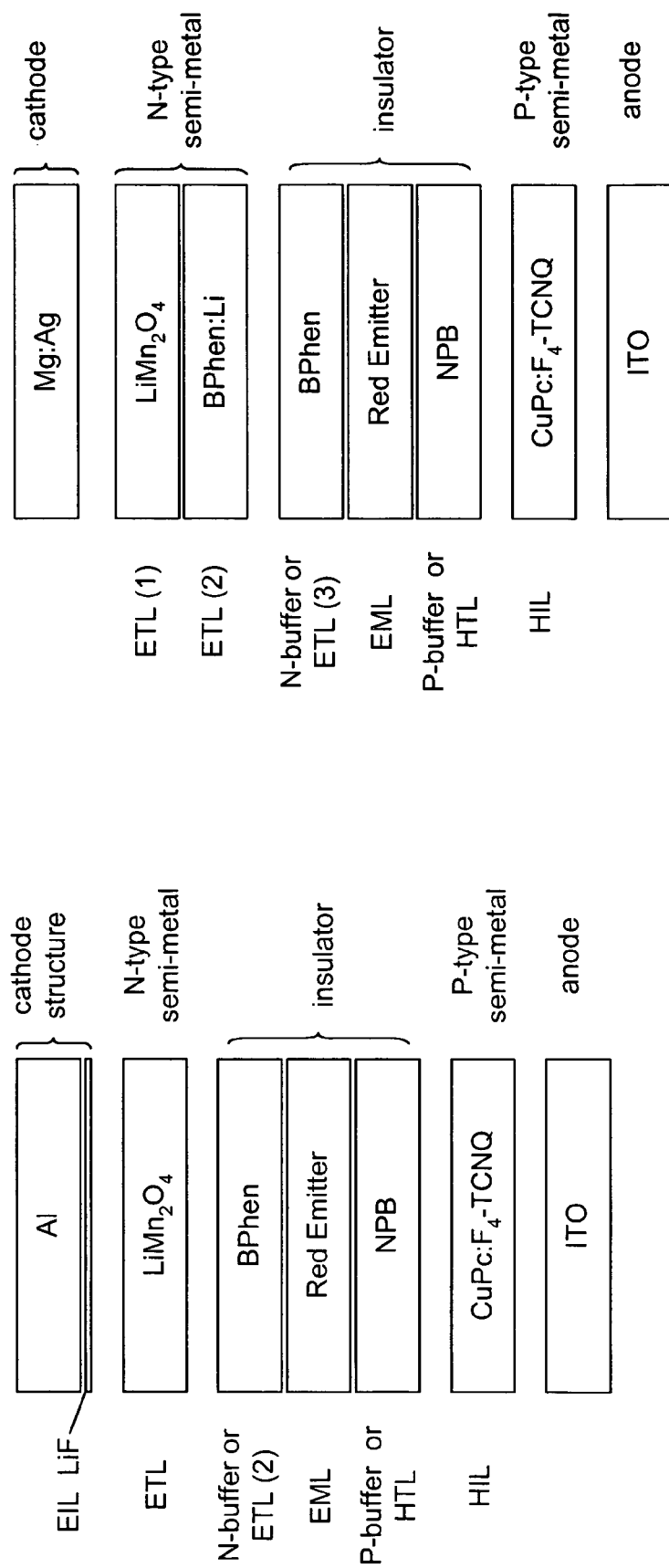
FIG. 9a is a schematic representation showing an OLED, according to an embodiment of the present invention, wherein the hole source is made of an organic material.
FIG. 9b is a schematic representation showing an OLED, according to another embodiment of the present invention, wherein the hole source is made of an organic material.

FIGS. 9a-12 show different embodiments of the present invention. FIGS. 9a-9c are exemplary embodiments of the present invention, wherein the hole source is made of an organic material. As shown in FIG. 9a, the hole source contains a hole injection layer (HIL) of $F_4$-TCNQ doped copper-phthalocyanine (CuPc). CuPc: $F_4$-TCNQ is a p-type dopant. The electron source comprises an electron transport layer (ETL) of $LiMn_2O_4$, an ion-intercalated inorganic material. The emissive region contains three layers: an emissive layer (EML), an N-buffer layer disposed between the emissive layer and the electron source and a P-buffer layer disposed between the emissive layer and the hole source. For example, the emissive layer contains an organic host doped with a red-emitting luminescent dopant; the N-buffer layer is made of 4,7-diphenyl-1,10-phenan-throline (BPhen); and the P-buffer layer is made of N,N'-bis-(1-naphthyl)-N,N'-diphenyl-1,1'-biphenyl-4,4' (NPB). The N-buffer layer is effectively another electron transport layer and the P-buffer layer is effectively a hole transport layer (HTL). The cathode structure comprises an aluminum electrode and a thin layer of LiF as an electron injection layer (EIL).

In addition to the $LiMn_2O_4$ layer, the electron source contains another electron transport layer made of BPhen:Li. In the embodiment as shown in FIG. 9b, the BPhen:Li layer is disposed between the $LiMn_2O_4$ layer and the emissive region. In the embodiment as shown in FIG. 9c, the BPhen:Li layer is disposed between the $LiMn_2O_4$ layer and the cathode. In the embodiments as shown in FIGS. 9b and 9c, the cathode structure comprises only an electrode made of Mg:Ag.

Figures 10B, 10C:
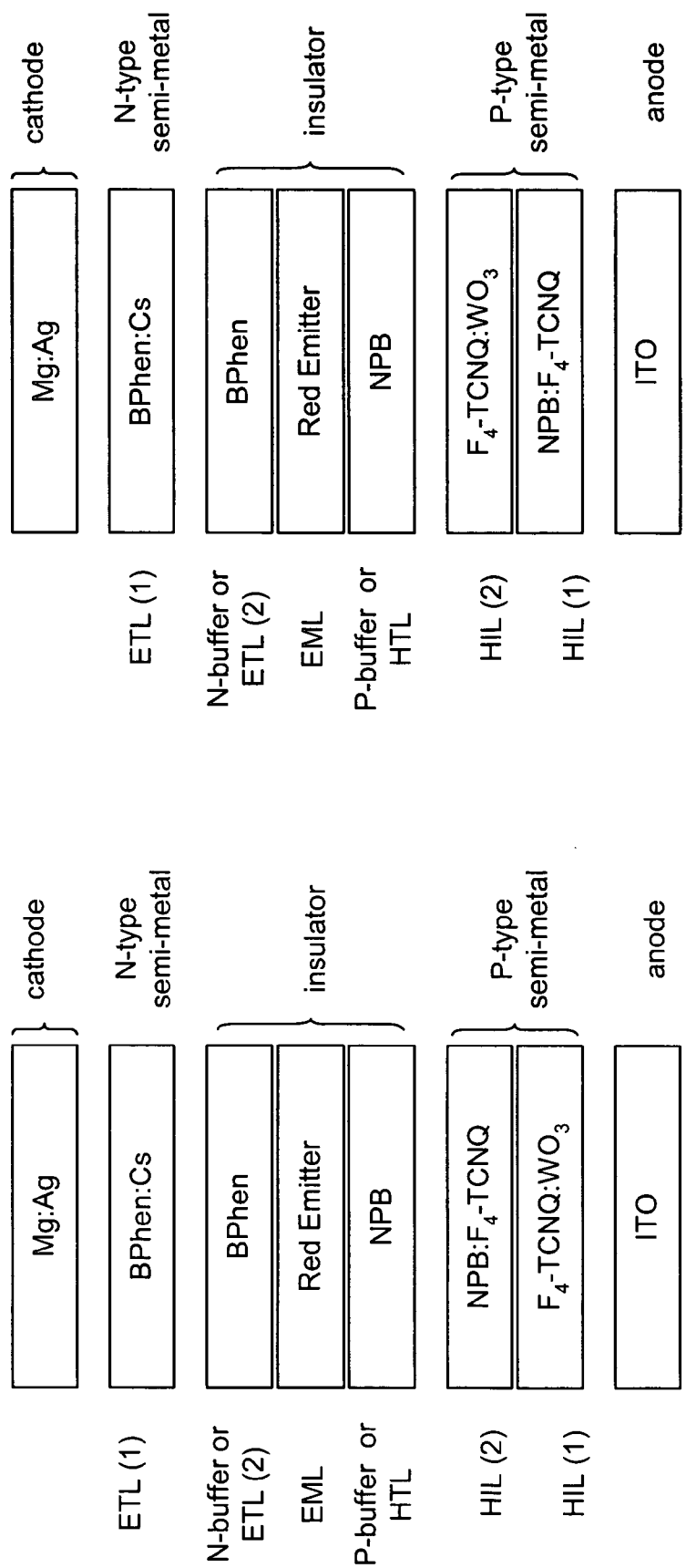
FIG. 10b is a schematic representation showing an OLED, according to another embodiment of the present invention, wherein the electron source is made of an organic material.
FIG. 10c is a schematic representation showing an OLED, according to yet another embodiment of the present invention, wherein the electron source is made of an organic material.

FIGS. 10a-10c are exemplary embodiments of the present invention, wherein the electron source is made of an organic material. As shown in FIG. 10a, the electron source contains an electron transport layer (ETL) of BPhen:Cs. The emissive region contains three layers: an emissive layer (EML), an N-buffer layer disposed between the emissive layer and the electron source and a P-buffer layer disposed between the emissive layer and the hole source. For example, the emissive layer contains an organic host doped with a red-emitting luminescent dopant; the N-buffer layer is made of 4,7-diphenyl-1,10-phenan-throline (BPhen); and the P-buffer layer is made of N,N'-bis-(1-naphthyl)-N,N'-diphenyl-1,1'-biphenyl-4,4' (NPB). The N-buffer layer is effectively another electron transport layer and the P-buffer layer is effectively a hole transport layer (HTL). In the embodiment as shown in FIG. 10a, the hole source comprises a hole injection layer of $F_4$-TCNQ doped tungsten oxide ($WO_3$) and the cathode structure comprises an aluminum electrode and an electron injection layer of LiF.

In the embodiments as shown in FIGS. 10b and 10c, the cathode structure contains a layer of Mg:Ag and the hole source further comprises another hole injection layer of NPB:$F_4$-TCNQ. In the embodiment as shown in FIG. 10b, the NPB:$F_4$-TCNQ layer is disposed adjacent to the emissive region. In the embodiment as shown in FIG. 10c, the NPB:$F_4$-TCNQ layer is disposed adjacent to the ITO anode.

FIG. 11 is a schematic representation showing an OLED, according to an embodiment of the present invention, wherein both the electron and hole sources are made of inorganic materials. In FIG. 11, the electron source comprises an electron transport layer of $LiMn_2O_4$ and the hole source comprises a hole injection layer of $F_4$-TCNQ:$WO_3$. The cathode structure comprises an aluminum electrode and an electron injection layer of LiF.

FIG. 12 is a schematic representation showing an OLED, according to an embodiment of the present invention, wherein each of the electron and hole sources comprises an inorganic material and an organic material. As shown in FIG. 12, the electron source further comprises an electron transport layer of BPhen:Li, and the hole source further comprises a hole injection layer of NPB:$F_4$-TCNQ.

In sum, in an OLED comprising a cathode structure, a hole source, an emissive region, an electron source and an anode, the present invention makes use of the electrical conductivity distribution among the hole source, the electron source and the emissive layer to improve the device efficiency. The materials for the hole source, the emissive region and the electron source are such that the electrical conductivity in the hole source and the electron source is higher than that of the emissive region, but lower than that of the cathode and anode. In particular, the electrical conductivity of the source layers is between $10^{-8}$ to $10^2$ S/cm. Furthermore, one or both of the hole source and the electron source are made substantially of one or more inorganic materials.

Furthermore, one or more buffer layers can be disposed between the electron source and the cathode. These buffer layers are parts of the emissive region.

Thus, although the present invention has been described with respect to one or more embodiments thereof, it will be understood by those skilled in the art that the foregoing and various other changes, omissions and deviations in the form and detail thereof may be made without departing from the scope of this invention.

What is claimed is:

1. An organic light-emitting device comprising:
   a cathode;
   an anode; and
   a layer structure disposed between the cathode and the anode; the layer structure comprising:
   a hole source region disposed adjacent to the anode;
   an electron source region disposed adjacent to the cathode; and
   an emissive region disposed between the hole source region and the electron source region, such that the emissive region is immediately adjacent to the hole source region and immediately adjacent to the electron source region, the emissive region made of at least one organic host material doped with one or more luminescent dopants, each of the hole source region, the electron source region and the emissive region having an electrical conductivity, wherein
   the electrical conductivity of the hole source region is between $10^{-8}$ to $10^2$ S/cm;
   the electrical conductivity of the electron source region is between $10^{-8}$ to $10^2$ S/cm;
   the electrical conductivity of the emissive region is lower than $10^{-8}$ S/cm; and
   the electrical conductivity of the cathode and the anode is higher than $10^2$ S/cm, and wherein at least one of the hole source and the electron source regions comprises a layer made of an inorganic material, such that the electrical conductivity of the emissive region is lower than the electrical conductivity of the immediately adjacent electron source region and the immediately adjacent hole source region, wherein the electron source region comprises a layer of $LiMn_2O_4$ and a layer of BPhen:Li.

2. The device of claim 1, wherein the hole source region contains a P-type semi-metal, the electron source region contains an N-type semi-metal, and the emissive region contains an electrical insulator.

3. The device of claim 1, wherein the hole source region comprises a layer of ion-intercalated inorganic material and the electron source region comprises a layer of ion-doped organic material.

4. The device of claim 1, wherein the hole source region comprises a layer of ion-intercalated inorganic material and the electron source region comprises a layer of ion-intercalated inorganic material.

5. The device of claim 1, wherein the hole source region comprises a layer of ion-doped organic material and the electron source region comprises a layer of ion-intercalated inorganic material.

6. The device of claim 1, wherein the emissive region comprises an emissive layer and a P-buffer layer disposed between the emissive layer and the hole source region.

7. The device of claim 1, wherein the emissive region comprises an emissive layer and an N-buffer layer disposed between the emissive layer and the electron source region.

8. The device of claim 1, wherein the hole source region comprises one or more layers containing TCNQ.

9. The device of claim 1, further comprising an electron injection layer disposed between the cathode and the electron source region.

10. The device of claim 9, wherein the electron injection layer comprises a layer of LiF.

11. An organic light-emitting device comprising:
    a cathode;
    an anode; and
    a layer structure disposed between the cathode and the anode; the layer structure comprising:
    a hole source region disposed adjacent to the anode;
    an electron source region disposed adjacent to the cathode; and
    an emissive region disposed between the hole source region and the electron source region, such that the emissive region is immediately adjacent to the hole source region and immediately adjacent to the electron source region, the emissive region made of at least one organic host material doped with one or more luminescent dopants, each of the hole source region, the electron source region and the emissive region having an electrical conductivity, wherein
    the electrical conductivity of the hole source region is between $10^{-8}$ to $10^2$ S/cm;
    the electrical conductivity of the electron source region is between $10^{-8}$ to $10^2$ S/cm;
    the electrical conductivity of the emissive region is lower than $10^{-8}$ S/cm; and
    the electrical conductivity of the cathode and the anode is higher than $10^2$ S/cm, and wherein at least one of the hole source and the electron source regions comprises a layer made of an inorganic material, such that the electrical conductivity of the emissive region is lower than the electrical conductivity of the immediately adjacent electron source region and the immediately adjacent hole source region, wherein the hole source region comprises a layer of $NPB:F_4$-TCNQ and a layer of $F_4$-TCNQ:$WO_3$.

12. The device of claim 1, wherein the electron source region comprises one or more layers containing alkali or alkaline earth metal.

13. An organic light-emitting device comprising:
    a cathode;
    an anode; and
    a layer structure disposed between the cathode and the anode; the layer structure comprising:
    a hole source region disposed adjacent to the anode;
    an electron source region disposed adjacent to the cathode; and
    an emissive region disposed between the hole source region and the electron source region, such that the emissive region is immediately adjacent to the hole source region and immediately adjacent to the electron source region, the emissive region made of at least one organic host material doped with one or more luminescent dopants, each of the hole source region, the electron source region and the emissive region having an electrical conductivity, wherein
    the electrical conductivity of the hole source region is between $10^{-8}$ to $10^2$ S/cm;
    the electrical conductivity of the electron source region is between $10^{-8}$ to $10^2$ S/cm;

the electrical conductivity of the emissive region is lower than $10^{-8}$ S/cm; and the electrical conductivity of the cathode and the anode is higher than $10^2$ S/cm, and wherein at least one of the hole source and the electron source regions comprises a layer made of an inorganic material, such that the electrical conductivity of the emissive region is lower than the electrical conductivity of the immediately adjacent electron source region and the immediately adjacent hole source region, wherein the hole source region comprises one or more layers containing TCNQ, and wherein the hole source region comprises a layer of $F_4$-TCNQ:$WO_3$.

* * * * *

UNITED STATES PATENT AND TRADEMARK OFFICE
CERTIFICATE OF CORRECTION

PATENT NO. : 7,635,858 B2  Page 1 of 1
APPLICATION NO. : 11/200956
DATED : December 22, 2009
INVENTOR(S) : Tswen-Hsin Liu It is certified that error appears in the above-identified patent and that said Letters Patent is hereby corrected as shown below:

*In Column 8, line 44, claim 12, line 1:*

*"claim 1" should be --claim 11--*

Signed and Sealed this

Twenty-seventh Day of July, 2010

David J. Kappos
*Director of the United States Patent and Trademark Office*